US012642012B2

(12) United States Patent
Choi et al.

(10) Patent No.: US 12,642,012 B2
(45) Date of Patent: May 26, 2026

(54) MEMORY DEVICE AND MEMORY APPARATUS INCLUDING THE SAME

(71) Applicant: KOREA ADVANCED INSTITUTE OF SCIENCE AND TECHNOLOGY, Daejeon (KR)

(72) Inventors: Shinhyun Choi, Daejeon (KR); See-On Park, Daejeon (KR); Jongmin Bae, Daejeon (KR); Hakcheon Jeong, Daejeon (KR); Jongyong Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 446 days.

(21) Appl. No.: 18/326,530

(22) Filed: May 31, 2023

(65) Prior Publication Data

US 2024/0365688 A1      Oct. 31, 2024

(30) Foreign Application Priority Data

Apr. 25, 2023    (KR) ........................ 10-2023-0054202

(51) Int. Cl.
| | |
|---|---|
| *H10N 70/20* | (2023.01) |
| *H10B 63/00* | (2023.01) |
| *H10N 70/00* | (2023.01) |

(52) U.S. Cl.
CPC ........... *H10N 70/231* (2023.02); *H10B 63/80* (2023.02); *H10N 70/826* (2023.02); *H10N 70/841* (2023.02); *H10N 70/8833* (2023.02); *H10N 70/026* (2023.02)

(58) Field of Classification Search
CPC .................................................... H10N 70/231
See application file for complete search history.

(56) References Cited

U.S. PATENT DOCUMENTS

| | | | |
|---|---|---|---|
| 8,426,836 | B2 | 4/2013 | Mikawa et al. |
| 9,997,705 | B2 | 6/2018 | Tour et al. |
| 11,165,021 | B2 | 11/2021 | Jiang et al. |
| 2010/0258778 | A1 | 10/2010 | Sung |
| 2013/0193396 | A1 | 8/2013 | Nakano et al. |

(Continued)

FOREIGN PATENT DOCUMENTS

| | | |
|---|---|---|
| KR | 10-2007-0089382 A | 8/2007 |
| KR | 10-2010-0113300 A | 10/2010 |

(Continued)

OTHER PUBLICATIONS

See-On Park et al., "Experimental demonstration of highly reliable dynamic memristor for artificial neuron and neuromorphic computing", Nature Communications, 2022, vol. 12, pp. 1-13.

*Primary Examiner* — Mounir S Amer
(74) *Attorney, Agent, or Firm* — Sughrue Mion, PLLC

(57) ABSTRACT

Disclosed are a memory device and a memory apparatus including the memory device. The memory device includes a first electrode, a second electrode spaced apart from the first electrode, and a resistance change layer arranged between the first electrode and the second electrode and doped with a halogen element in a metal oxide having an oxygen content that gradually changes from the second electrode to the first electrode.

17 Claims, 12 Drawing Sheets

(56)                    References Cited

U.S. PATENT DOCUMENTS

| 2014/0063912 A1* | 3/2014 | Aiga | H10N 70/24 |
| | | | 257/2 |
| 2018/0277601 A1* | 9/2018 | Ahn | H10B 63/80 |
| 2018/0287058 A1 | 10/2018 | Xia et al. | |
| 2020/0313085 A1* | 10/2020 | Jang | H10N 70/883 |
| 2022/0131096 A1* | 4/2022 | Wang | H10K 19/202 |
| 2024/0040802 A1* | 2/2024 | Wu | H10B 63/30 |

FOREIGN PATENT DOCUMENTS

| KR | 10-2016-0088380 A | 7/2016 |
| KR | 10-2018-0109287 A | 10/2018 |
| KR | 10-2019-0065980 A | 6/2019 |
| KR | 10-2019-0119971 A | 10/2019 |
| KR | 10-2021-0045278 A | 4/2021 |

* cited by examiner

MEMORY DEVICE AND MEMORY APPARATUS INCLUDING THE SAME

CROSS-REFERENCE TO RELATED APPLICATION

This application is based on and claims priority under 35 U.S.C. § 119 to Korean Patent Application No. 10-2023-0054202, filed on Apr. 25, 2023, in the Korean Intellectual Property Office, the disclosure of which is incorporated by reference herein in its entirety.

BACKGROUND

1. Field

The disclosure relates to a memory device and a memory apparatus including the memory device, and more particularly, to a memristor-type memory device and a memory apparatus including the memory device.

This research was carried out with support of Samsung Future Technology Development Project (Task number: SRFC-IT2101-04).

2. Description of the Related Art

A memristor, a type of memory device, is a device that stores and processes information by changing an internal resistance value, and has attracted attention due to its very small size and simple structure. Unlike related-art memory devices such as dynamic random access memory (DRAM) and flash memory which use three electrodes, use of elec-trodes allows for a process with higher integration in a limited area.

In addition, because memristors have analog characteris-tics capable of representing various values between 0 and 1, unlike related-art memories that store only 1 and 0, a single element may represent various values. Memristors have been actively studied for use in various fields, such as neuromorphic and in-memory computing as well as memory technologies, due to their high integration characteristics and analog information storage characteristics.

SUMMARY

An embodiment provides a memory device including a resistance change layer in which an oxygen content gradu-ally changes, and a memory apparatus including the memory device.

An embodiment provides a memory device having a high rectification ratio and a memory apparatus including the memory device.

An embodiment provides a memory device having a high resistance switching ratio and a memory apparatus including the memory device.

An embodiment provides memory devices and memory apparatus with time uniformity.

An embodiment provides memory devices and memory apparatuses with spatial uniformity.

Additional aspects will be set forth in part in the descrip-tion that follows and, in part, will be apparent from the description, or may be learned by practice of the embodi-ments of the disclosure.

According to one or more embodiments of the disclosure, a memory device includes a first electrode, a second elec-trode spaced apart from the first electrode, and a resistance change layer arranged between the first electrode and the second electrode and doped with a halogen element in a metal oxide having an oxygen content that gradually changes from the second electrode to the first electrode.

The halogen element may include at least one of fluorine (F), chlorine (CI), and bromine (Br).

A doping content of the halogen for the resistance change layer may be about 10 at % or less.

The metal oxide may include an anodized metal oxide.

The metal oxide may include tantalum (Ta), titanium (Ti), tin (Sn), chromium (Cr), manganese (Mn), hafnium (Hf), aluminum (Al), niobium (Nb), silicon (Si), lanthanum (La), zirconium (Zr), scandium (Sc), tungsten (W), vanadium (V), and molybdenum (Mo).

The content of oxygen in the resistance change layer may gradually decrease from the second electrode to the first electrode.

The resistance change layer may includes a metal-like region adjacent to the first electrode and having a metal property greater than an insulating property, and an insula-tor-like region adjacent to the second electrode and having an insulating property greater than an insulating property of a metal.

When an electric field is formed in the resistance change layer in a direction from the second electrode to the first electrode, a thickness of the metal-like region may increase while a thickness of the insulator-like region decreases.

A thickness of the metal-like region and a thickness of the insulator-like region may each change according to a move-ment of oxygen ions included in the resistance change layer.

The oxygen ions may move through an entire cross-section of the resistance change layer.

When the thickness of the insulator-like region is less than or equal to a reference thickness, the resistance change layer may be in a low resistance state.

When a formed electric field is dissipated, the thickness of the metal-like region and the thickness of the insulator-like region may be restored to original states.

The resistance change layer may be non-porous.

The resistance change layer may include at least one of polycrystalline phase and amorphous phase.

An interface adjacent to the first electrode of the resis-tance change layer may have more polycrystalline phase than amorphous phase.

An interface adjacent to the second electrode of the resistance change layer may have more amorphous phase than polycrystalline phase.

The first electrode may include a same material as a metal included in the resistance change layer.

The memory device may have a rectification ratio of about $10^4$ or more.

The memory device may have a resistance switching ratio of about $10^2$ or more.

According to one or more embodiments, a memory appa-ratus includes a first conductive line extending in a first direction, a second conductive line spaced apart from the first conductive line and extending in a second direction crossing the first direction, and a memory device arranged at an intersection of the first conductive line and the second conductive line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
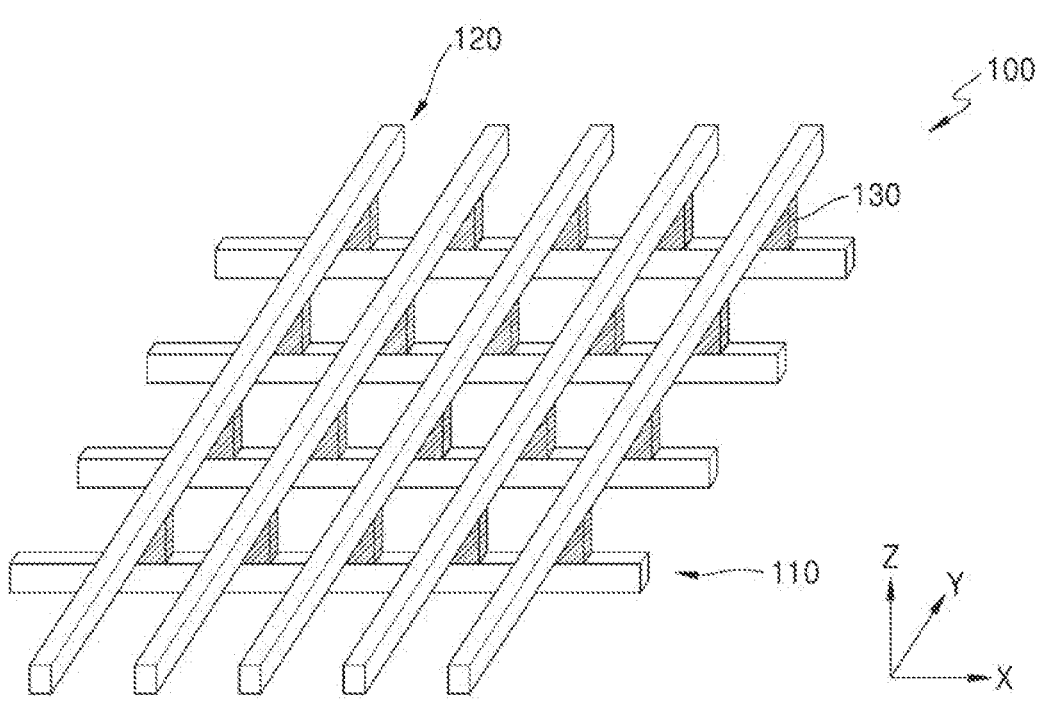
FIG. 1 is a diagram conceptually illustrating a memory apparatus having a cross point array according to an embodiment of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments may be described in detail with reference to the accompanying drawings. In the following drawings, the same reference numerals denote the same elements, and the size of each element in the drawings may be exaggerated for clarity and convenience of description. On the other hand, the embodiments described below are merely illustrative, and various modifications are possible from these embodiments.

Hereinafter, what is described as "above" or "on" may include not only what is directly above, below, left, and right in contact, but also what is above, below, left, and right in non-contact. An expression used in the singular may encompass the expression in the plural, unless it has a clearly different meaning in the context. In addition, when a portion may "include" a certain element, the portion may further include another element instead of excluding the other element, unless otherwise stated.

The use of the term "the" and similar denoting terms may correspond to both singular and plural. Unless the order of operations included in a method is explicitly stated or stated to the contrary, these operations may be performed in any suitable order, and are not necessarily limited to the order described.

Alternatively, terms, such as "unit", "-er/or", and "module", described in the specification mean a unit that processes at least one function or operation, which may be implemented as hardware or software or a combination of hardware and software.

Connections of lines or connecting members between elements shown in the drawings are examples of functional connections and/or physical or circuit connections, which can be replaced in actual apparatuses or additional various functional connections, physical connections, or as circuit connections.

Expressions, such as "at least one" preceding a list of elements limit the entire list of elements, not individual elements of the list. For example, an expression, such as "at least one of A, B, and C" or "at least one selected from the group consisting of A, B, and C" means only A, only B, only C, or a combination of two or more of A, B, and C, such as ABC, AB, BC, and AC.

In a case in which "about" or "substantially" is used in reference to a numerical value, the related numerical value is to be construed to include manufacturing or operating variations (e.g., ±10%) around the stated numerical value. Alternatively, when the expressions "in general" and "substantially" are used in reference to geometric shapes, it may be intended that geometrical precision is not required and latitude for the shapes is within the scope of the present embodiment. Alternatively, regardless of whether the numerical values or shapes are limited to "about" or "substantially", such values and shapes are to be construed as including manufacturing or operating variations (e.g., ±10%) around the stated numerical values.

While such terms as "first", "second", etc., may be used to describe various elements, such elements must not be limited to the above terms. The above terms may be used only to distinguish one element from another.

The use of all examples and exemplary terms is simply for explaining technical ideas in detail, and the scope is not limited due to these examples or exemplary terms unless limited by the claims.

Hereinafter, with reference to the accompanying drawings, it may be described in detail only by way of example.

FIG. 1 is a diagram conceptually illustrating a memory apparatus having a cross point array according to an embodiment of the disclosure. Referring to FIG. 1, a memory device 100 may include a plurality of first conductive lines 110 each extending in a first direction (e.g., an X direction), a plurality of second conductive lines 120 arranged spaced apart from the plurality of first conductive lines 110 and each extending in a second direction (e.g., a Y direction), and a plurality of memory devices 130.

The plurality of first conductive lines 110 may each extend parallel to each other in the first direction (the X direction). The plurality of second conductive lines 120 may each extend parallel to each other in the second direction (e.g., the Y direction). As shown in the X direction and the Y direction of FIG. 1, the plurality of first conductive lines 110 and the plurality of second conductive lines 120 may cross each other perpendicularly, but are not limited thereto. In terms of driving the memory apparatus, the plurality of first conductive lines 110 may correspond to one of a word line and a bit line, and the plurality of second conductive lines 120 may correspond to the other one.

The plurality of first conductive lines 110 and the plurality of second conductive lines 120 may each independently be made of metal, conductive metal nitride, conductive metal oxide, or a combination thereof. For example, the plurality of first conductive lines 110 and the plurality of second conductive lines 120 may each include at least one of tungsten (W), tungsten nitride (WN), gold (Au), silver (Ag), copper (Cu), aluminum (Al), titanium (Ti), iridium (Ir), platinum (Pt), palladium (Pd), ruthenium (Ru), zirconium (Zr), rhodium (Rh), nickel (Ni), cobalt (Co), chromium (Cr), tin (Sn), silicon (Si), selenium (Se), tellurium (Te), antimony (Sb), zinc (Zn), and indium tin oxide (ITO). In addition, each of the plurality of first conductive lines 110 and the plurality of second conductive lines 120 may independently include a metal film and a conductive barrier layer covering part or all of the metal film. The conductive barrier layer may be made of, for example, Ti, titanium nitride (TiN), tantalum (Ta), tantalum nitride (TaN), or a combination thereof.

The plurality of memory devices 130 may be spaced apart from each other, and may be arranged in areas where the plurality of first conductive lines 110 and the plurality of second conductive lines 120 cross each other between the plurality of first conductive lines 110 and the plurality of second conductive lines 120.

The memory device 100 may further include a first control circuit (not shown) coupled to the memory device 130 through each of the first conductive lines 110. In an embodiment, the first control circuit may include a multiplexer (not shown) for selecting a specific first conductive line 110 from among the plurality of first conductive lines 110.

The memory apparatus 100 may further include a second control circuit (not shown) coupled to the memory devices 130 through each of the second conductive lines 120. In an embodiment, the second control circuit may include a demultiplexer, sensing circuitry, and input/output (I/O) pads. The demultiplexer may selectively couple to the sensing circuitry of the second conductive line 120 of the selected memory device 130.

The first control circuit and the second control circuit may individually access the memory device 130 by activating the first conductive line 110 and the second conductive line 120 coupled to the selected memory device 130. During a write operation, the first control circuit may write information in the selected memory device 130 by applying a certain voltage to the selected first conductive line 110. The demultiplexer may activate the selected memory device 130 by, for example, grounding the selected memory device 130. In this case, a logic value may be written while a current affecting characteristics of the memory device 130 flows through the selected memory device 130.

Although FIG. 1 shows a memory apparatus including a horizontally extended memory device array, the disclosure is not limited thereto. For example, the memory apparatus may include a three-dimensional memory device array in which two or more memory device arrays are stacked a plurality of times on a substrate and extended in a vertical direction.

Figure 2:
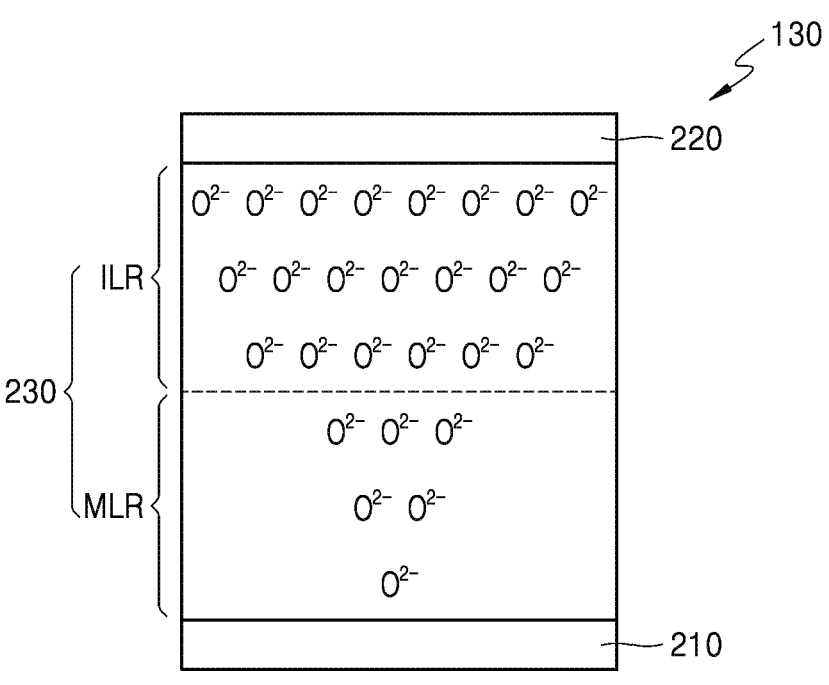
FIG. 2 is a diagram illustrating a memory device shown in FIG. 1.

FIG. 2 is a diagram illustrating the memory device 130 shown in FIG. 1. Referring to FIG. 2, the memory device 130 may include a first electrode 210, a second electrode 220 spaced apart from the first electrode 210, and a resistance change layer 230 which is between the first electrode 210 and the second electrode 220 and of which resistance changes according to an applied electric field. The first electrode 210 is arranged below the resistance change layer 230 and may be referred to as a bottom electrode, and the second electrode 220 is arranged above the resistance change layer 230 and may be referred to as an upper electrode. The first electrode 210 may be integral with the first conductive line 110 or may be a partial area of the first conductive line 110, and the second electrode 220 may be integrated with the second conductive line 120 or may be a partial area of the second conductive line 120.

Each of the first electrode 210 and the second electrode 220 may independently be made of a metal, a conductive metal nitride, a conductive metal oxide, or a combination thereof. For example, each of the first and second electrodes 210 and 220 may include at least one of Ti, W, Al, Au, Pt, Pd, Si, Te, Se, Sb, and Zr. Alternatively, the first electrode 210 may include at least one of Ti, W, and Al as an oxidizable reactive metal, and the second electrode 220 may include a noble metal including at least one of Au, Pt, and Pd, or may include a material that is both conductive and bondable to oxygen, including at least one of Si, Te, Se, Sb, and Zr.

The resistance change layer 230 may include a metal oxide of which oxygen content gradually changes from the second electrode 220 to the first electrode 210. For example, the oxygen content included in the resistance change layer 230 may gradually decrease from the second electrode 220 to the first electrode 210. Alternatively, an interface in contact with the second electrode 220 of the resistance change layer 230 may have the highest oxygen content, and an interface in contact with the first electrode 210 of the resistance change layer 230 may have the lowest oxygen content. The oxygen content included in the resistance change layer 230 may change linearly or in a curved fashion.

A metal oxide according to an embodiment of the disclosure may be an anodized metal oxide. Anodization is a process of forming a metal oxide from a metal thin film through an electrochemical reaction in an electrolyte. In the metal oxide formed using anodization, the oxygen content may be distributed differently from the surface of the oxide depending on the thickness, unlike a case of vacuum deposition.

The resistance change layer 230 may be a binary metal oxide. The metal oxide may be formed of an oxide including at least one of Ta, Ti, Sn, Cr, and Mn. For example, the binary metal oxide included in the resistance change layer 230 may include at least one of tantalum oxide ($TaO_x$), titanium oxide ($TiO_x$), tin oxide ($SnO_x$), chromium oxide ($CrO_x$), and manganese oxide ($MnO_x$).

The resistance change layer 230 may be a ternary metal oxide. For example, the resistance change layer 230 may include first metal elements, second metal elements, and oxygen elements, which are different each other. In the metal oxide, content of the first metal element may be greater than content of the second metal element. The first metal element may include one of Ta, Ti, Sn, Cr, and Mn, and the second metal element may include one of hafnium (Hf), Al, niobium (Nb), lanthanum (La), Zr, scandium (Sc), W, vanadium (V), and molybdenum (Mo).

Alternatively, the resistance change layer 230 may be a metal oxide including a metal element, a Si element, and an oxygen element. The content of the metal element in the metal oxide may be greater than the content of the Si element. The metal element may include one of Ta, Ti, Sn, Cr, and Mn.

A degree of distribution of the oxygen content in the resistance change layer 230 may be determined during a manufacturing process. For example, when the metal oxide is formed by anodization, the oxygen content may be distributed such that the oxygen content decreases as a distance from a surface of the metal oxide increases. A change in oxygen content may be controlled by adjusting a magnitude of a voltage and a concentration of a solution at the time of anodization. For example, when anodization is rapidly performed at a high voltage, a slope of the change in oxygen content according to a thickness may be steep. On the other hand, when the anodization proceeds slowly at a low voltage, the slope of the change in oxygen content according to the thickness may be gentle.

The resistance change layer 230 may be further doped with a halogen element. For example, the resistance change layer 230 may be doped with at least one of fluorine (F), chlorine (Cl), and bromine (Br). A doping content of a halogen element for the resistance change layer 230 may be 10 at % or less. The halogen element may lower an activation energy of oxygen ions included in the metal oxide. Thus, a movement of oxygen ions in the resistance change layer 230 may be facilitated.

The halogen element may be doped together when forming the metal oxide. For example, anodization may proceed in a state in which an aqueous solution including a halogen precursor is provided to a metal thin film. During anodization, content of the halogen elements may gradually vary depending on a thickness of the metal oxide. For example, the content of the halogen element may gradually decrease from the second electrode 220 to the first electrode 210.

The resistance change layer 230 may include metal cations and oxygen anions. In the resistance change layer 230, a region in which metal properties are stronger than insulating properties due to a small amount of oxygen anions is called a metal-like region (MLR), and a region in which the insulating properties are stronger than the metal properties due to a large amount of oxygen anions is called an insulator-like region (ILR). The MLR may be a region of the resistance change layer 230 adjacent to the first electrode 210, and the ILR may be a region of the resistance change layer 230 adjacent to the second electrode 220. Accordingly, the MLR and the ILR may be sequentially arranged between the first electrode 210 and the second electrode 220. The MLR and the ILR may be changed by a movement of oxygen ions.

The resistance change layer 230 may include polycrystalline phase and amorphous phase. In the resistance change layer 230, amorphous phase may gradually increase and polycrystalline phase may gradually decrease in a direction from the first electrode 210 to the second electrode 220.

A first region (not shown) adjacent to the first electrode 210 of the resistance change layer 230 may have more polycrystalline phase than amorphous phase, and a second region (not shown) adjacent to the second electrode of the resistance change layer 230 may have more amorphous phase than polycrystalline phase. Here, the first region may include an interface of the resistance change layer 230 in contact with the first electrode 210, and the second region may include an interface of the resistance change layer 230 in contact with the second electrode 220.

The first region may have a high metal content and many polycrystalline phase, and the second region may have a high oxygen content and a lot of amorphous phase. In particular, the interface in contact with the second electrode 220 of the resistance change layer 230 may be completely amorphous. Because an activation energy of oxygen ions is low in the amorphous second region, the movement of oxygen ions is easy, leading to a large resistance switching ratio, that is, an on/off ratio.

The first region may be the same as the MLR, but is not limited thereto. The MLR may refer to a smaller region including the first region. Similarly, the second region may be the same as the ILR, but is not limited thereto. The ILR may refer to a wider region including the second region. While the MLR and the ILR are changed according to the movement of oxygen ions, the first region and the second region are not changed.

The resistance change layer 230 may be non-porous. In other words, the resistance change layer 230 may not include nanopores or the like. Because the resistance change layer 230 is non-porous, free movement of oxygen ions may be restricted. In addition, the non-porous resistance change layer 230 may increase durability of the memory device 130.

Figure 3A:
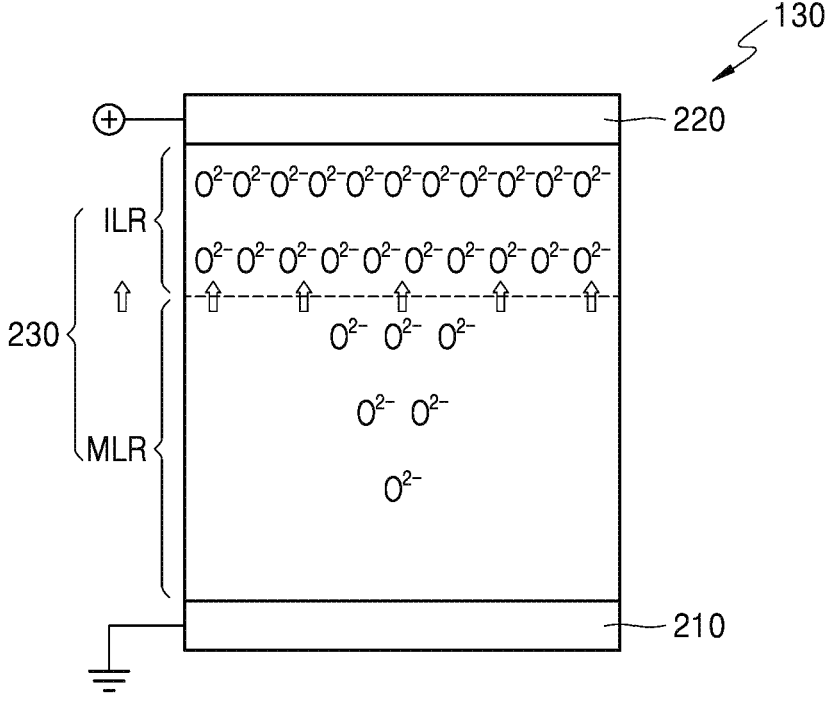
FIGS. 3A and 3B are diagrams illustrating the principle of operation of a memory device according to an embodiment of the disclosure.
Figure 3B:
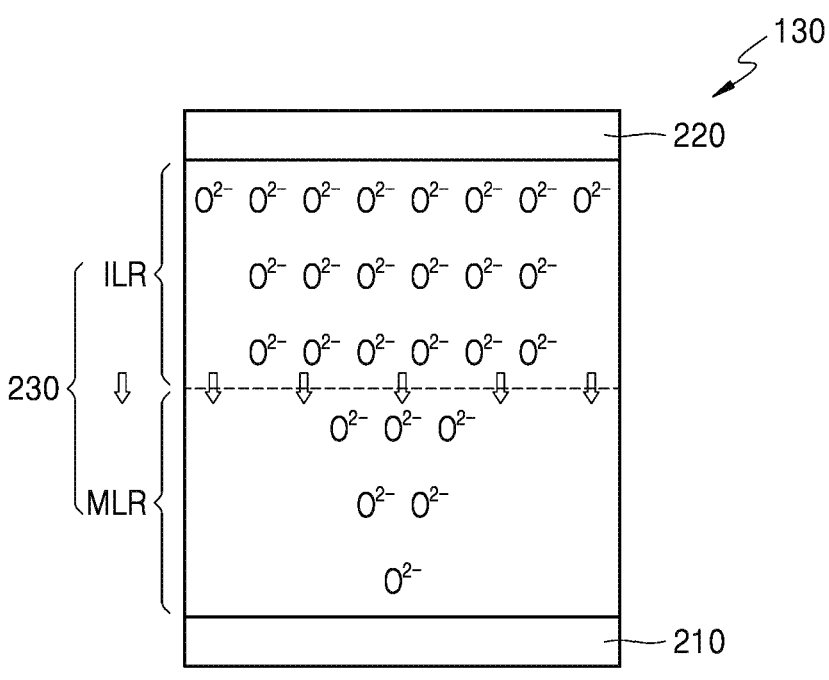

FIGS. 3A and 3B are diagrams illustrating the principle of operation of the memory device 130 according to an embodiment of the disclosure.

As shown in FIG. 3A, an electric field may be applied to the resistance change layer 230. For example, the first electrode 210 may be grounded and a positive voltage may be applied to the second electrode 220. Thus, an electric field may be formed in the resistance change layer 230 in a direction from the second electrode 220 to the first electrode 210. In a state in which the electric field is formed in the resistance change layer, oxygen ions that are anions distributed in the resistance change layer 230 may move toward the second electrode 220.

Due to the movement of the oxygen ions, the MLR may increase while the ILR may decrease. In other words, while a thickness of the MLR increases, a thickness of the ILR may decrease. As the thickness of the ILR decreases, a resistance of the resistance change layer 230 gradually decreases. Because there is more amorphous phase in the resistance change layer 230 toward the second electrode 220, the energy of the oxygen ions gradually decreases. Thus, the oxygen ions may move toward the second electrode 220 while being accelerated.

When the thickness of the ILR is less than or equal to a reference value, an insulating characteristic of the ILR is lost, and the resistance change layer 230 may be in a low resistance state as a whole. Information may be stored as current flows through the resistance change layer 230. Here, the reference value may be a thickness at which an insulating layer loses insulating properties. The reference value may vary depending on materials included in the resistance change layer 230.

Meanwhile, as shown in FIG. 3B, the electric field formed in the resistance change layer 230 may be dissipated. For example, voltage may not be applied to the first electrode 210 and the second electrode 220. The oxygen ions that have moved toward the second electrode 220 may be diffused due to a difference in content or concentration and move to the original positions thereof. As the oxygen ions move to the original positions thereof, sizes of the MLR and the ILR may be restored to the original states thereof. In other words, the thickness of the MLR decreases and the thickness of the ILR increases. As the thickness of the insulating ILR increases, the resistance change layer 230 returns to the original state thereof of high resistance. The resistance change layer 230 as a whole becomes in a high resistance state, so that current does not flow through the resistance change layer 230.

Meanwhile, an electric field opposite to a pre-formed electric field may be formed in the resistance change layer 230. For example, the first electrode 210 may be grounded, and a negative voltage may be applied to the second electrode 220. Then, an electric field may be formed from the first electrode 210 toward the second electrode 220, and oxygen ions may move toward the first electrode 210. According to the movement of the oxygen ions, the MLR may gradually decrease and the ILR may gradually increase.

In the resistance change layer 230, amorphous phase decreases and polycrystalline phase increases toward the first electrode 210, and thus, activation energy of the oxygen ions may increase. Thus, as the oxygen ions move in the direction of the first electrode 210, a movement speed may gradually decrease and then stop. In other words, even when a negative voltage is applied to the second electrode 220, the oxygen ions may stop at the original position thereof or within a certain range. This means that even when the number of operations of the memory device 130 increases, because a movement range of the oxygen ions is similar, it may be expected that a time deviation is uniform.

The memory device 130 according to an embodiment of the disclosure has a difference in that current flows in only one direction, whereas the memory device 130 according to the formation of a conductive filament has a current direction that may be changed according to a voltage direction. In addition, because the movement of the oxygen ions is limited, the memory device 130 according to an embodiment of the disclosure may stably operate even when the number of operations increases.

Figure 4A:
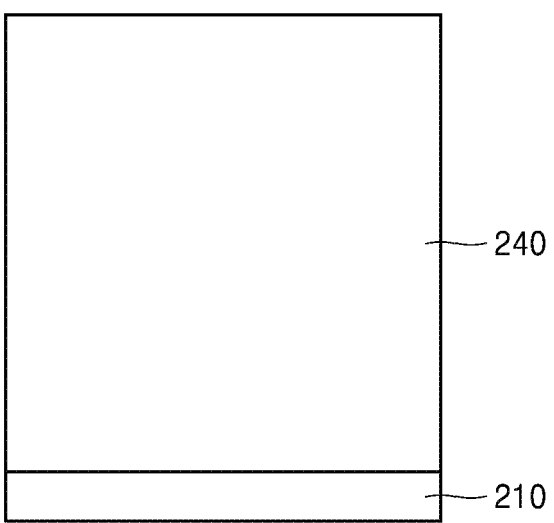
FIGS. 4A to 4C are reference diagrams for describing a method of manufacturing a memory device.
Figure 4B:
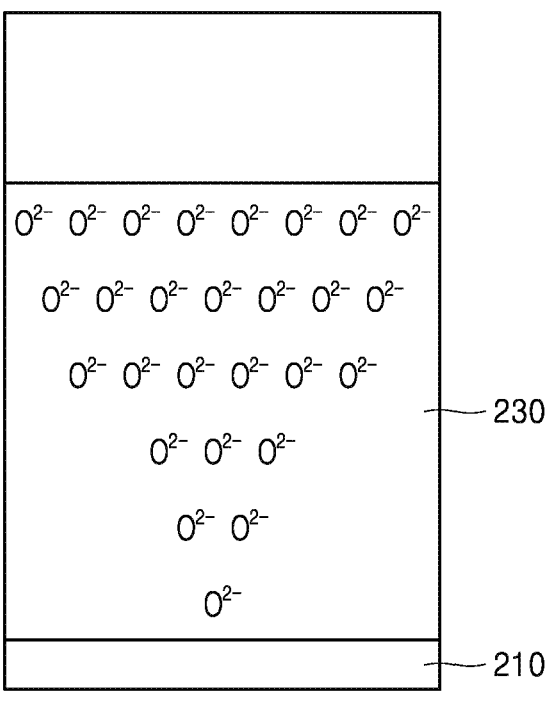
Figure 4C:
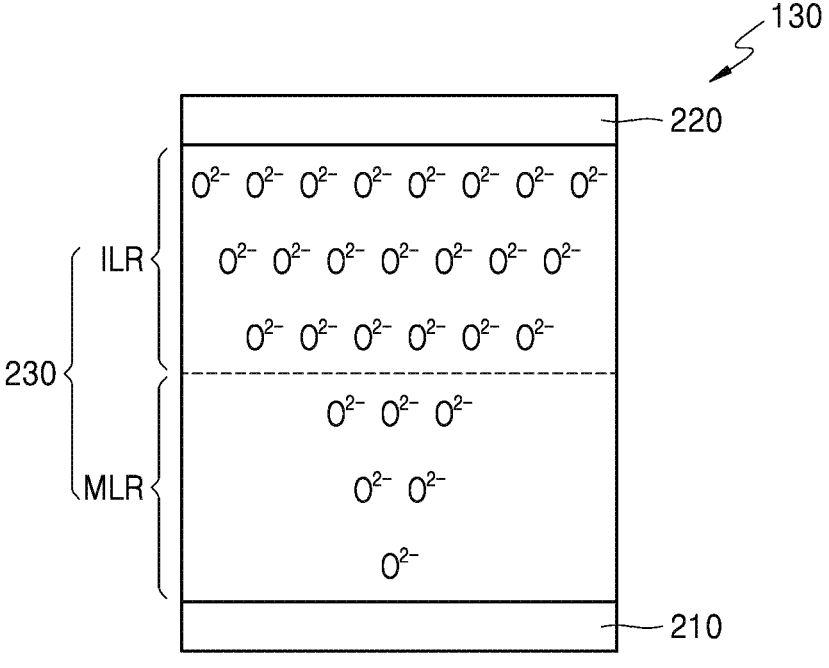

FIGS. 4A to 4C are reference diagrams illustrating a method of manufacturing the memory device 130.

As shown in FIG. 4A, a metal layer 240 may be formed on the first electrode 210. The first electrode 210 may be formed of a conductive material. For example, the first electrode 210 may include at least one of Ti, W, Al, Au, Pt, Pd, Te, Sb, and Zr. The metal layer 240 may be an oxidizable metal material. For example, the metal layer 240 may include at least one of Ti, W, and Al. Although the drawings show that the first electrode 210 and the metal layer 240 are formed of different materials, the disclosure is not limited thereto. The first electrode 210 and the metal layer 240 may be made of the same material. For example, a metal material including Ti, W, or Al may serve as the first electrode 210 and the metal layer 240.

As shown in FIG. 4B, the resistance change layer 230 may be formed by anodizing the metal layer 240. A halogen precursor and an aqueous solution may be provided as an electrolyte on a surface of the metal layer 240. For example, NH$_4$F 0.05 M, NaOH 0.05 M aqueous solution or ethylene glycol+NH$_4$F 0.1 M solution may be applied as the electrolyte. However, an electrolyte capable of anodization of the metal layer 240 may be applied in addition to the electrolyte described above. In addition, a voltage of 10 V may be applied to the metal layer 240 for about one minute. Then, the metal layer 240 may be anodized with a metal oxide and doped with a halogen element to become the resistance change layer 230.

Because the formation of the resistance change layer 230 may be performed at room temperature, other elements may be prevented from being damaged during the formation of the resistance change layer 230. Accordingly, durability of the memory device 130 and the memory apparatus may be improved.

The oxygen content of the resistance change layer 230 may vary according to the thickness of the resistance change layer 230. A surface of the resistance change layer 230 has a high oxygen content, and the oxygen content may gradually decrease toward the first electrode 210. This is because it is difficult to inject oxygen into the metal layer 240 during an anodization process. Thus, an upper surface of the metal layer 240 undergoes a longer oxidation time to form an oxygen-rich ILR, while a lower region of the metal layer 240 undergoes an anodization process for a shorter time. The lower region of the metal layer 240 may be an MLR with less oxygen.

Similarly, a surface of the resistance change layer 230 has the largest halogen content, and the halogen content may gradually decrease toward the first electrode 210.

The anodization method may effectively control a change of oxygen content. For example, the oxygen content gradient may be adjusted by a magnitude of voltage applied during anodization and an anodization time.

In FIG. 4, it is assumed that the resistance change layer in which the oxygen content gradually changes is formed by the anodization method. However, the disclosure is not limited thereto. However, other methods that can gradually change the oxygen content may be applied. For example, a resistance change layer in which the oxygen content gradually changes may be formed by an atomic layer deposition process or a reactive sputtering process.

Then, as shown in FIG. 4C, the second electrode 220 may be formed on the resistance change layer 230. The second electrode 220 may be a conductive material. The second electrode 220 may include at least one of Au, Pt, Pd, Si, Te, Se, Sb, and Zr. The second electrode 220 may be formed through a lithography process, but is not limited thereto.

Experimental Example

In the memory device 130 according to an embodiment of the disclosure, the first electrode 210 and the resistance change layer 230 were formed by anodizing an upper region of the metal layer 240 made of Ti, and the second electrode 220 made of Pt was formed on the resistance change layer 230. A thickness of the resistance change layer was about 30 nm. In the memory device 130 as a Comparative Example, a metal oxide was formed on the first electrode 210 made of Ti through a sputtering process and then heat-treated to form a resistance change layer. Then, the second electrode 220 made of Pt was formed on the resistance change layer 230. The thickness of the resistance change layer in Comparative Example was also set to about 30 nm.

Figure 5A:
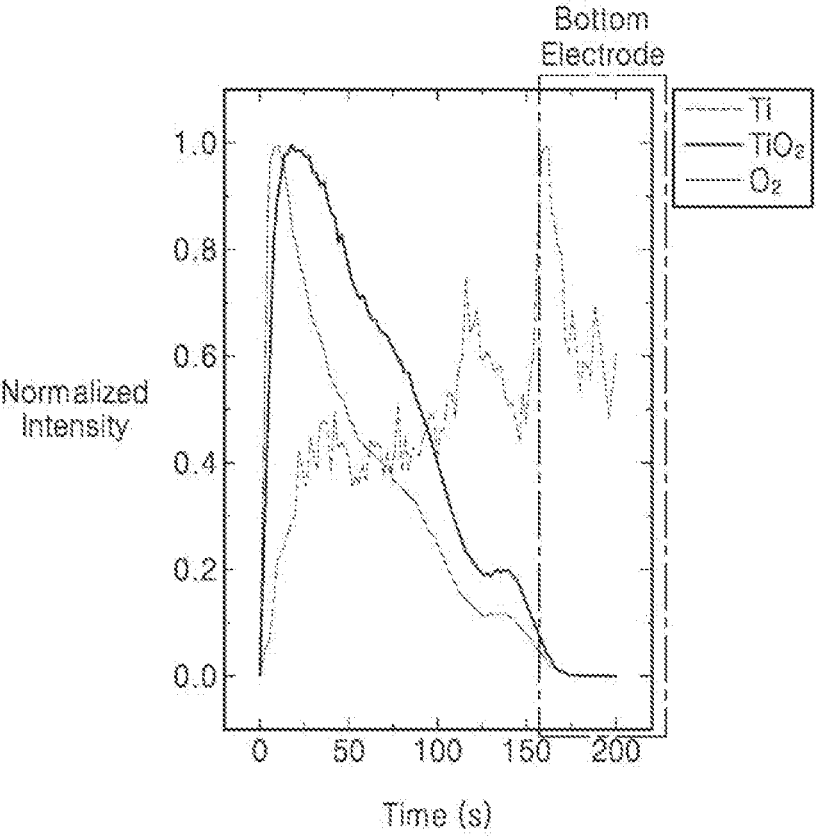
FIG. 5A is an analysis result of a memory device by using a time of flight secondary ion mass spectrometer (TOF-SIMS) according to an embodiment of the disclosure.
Figure 5B:
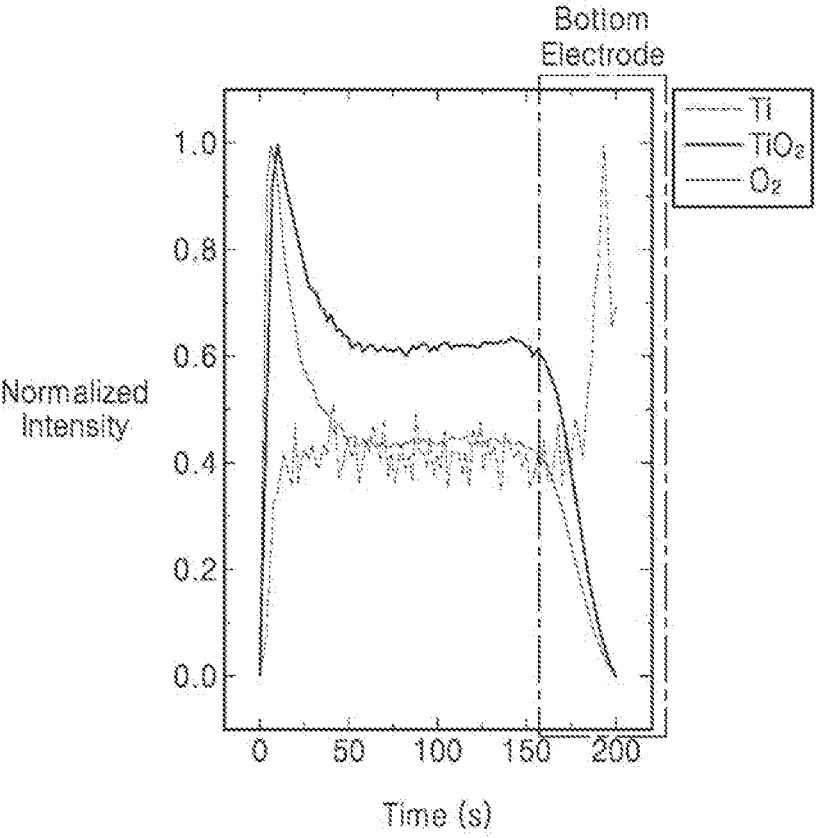
FIG. 5B is an analysis result by TOF-SIMS of a memory device as a comparative example.

FIG. 5A is an analysis result by a TOF-SIMS of a memory device according to an embodiment of the disclosure, and FIG. 5B is an analysis result by a TOF-SIMS of a memory device as a Comparative Example.

Oxygen, titanium dioxide, and titanium of the resistance change layer were normalized based on oxygen, titanium dioxide, and titanium at an interface of the resistance change layer in contact with the second electrode.

Referring to FIG. 5A, it may be seen that the oxygen content gradually increases from the second electrode 220 (i.e., upper electrode) to the first electrode 210 (i.e., bottom electrode) in the resistance change layer of the memory device according to an embodiment of the disclosure. In addition, it may be seen that an amount of titanium dioxide ($TiO_2$) gradually decreases from the second electrode 220 to the first electrode 210. On the other hand, it may be seen that the metal content, that is, the titanium content, tends to increase from the second electrode 220 to the first electrode 210.

Meanwhile, referring to FIG. 5B, it may be seen that the resistance change layer of the memory device as a Comparative Example has almost uniform oxygen content, $TiO_2$ content, and metal content regardless of thickness. It may be seen that it is difficult to manufacture a memory device in which the oxygen content is changed by a general sputtering process.

Figure 6:
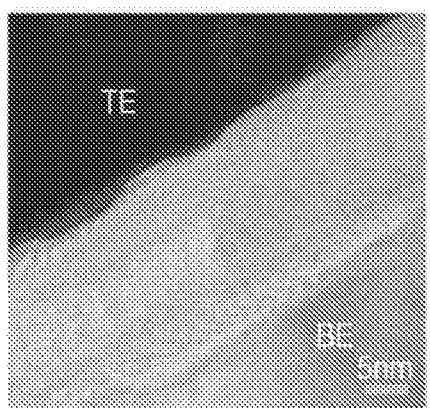
FIG. 6 shows a cross-sectional transmission electron microscopy image of a memory device according to an embodiment of the disclosure.

FIG. 6 shows a cross-sectional transmission electron microscopy image of a memory device according to an embodiment of the disclosure. As shown in FIG. 6, it may be seen that the anodized resistance change layer is nonporous. This may be expected to signify that the resistance change layer has high durability.

Figure 7:
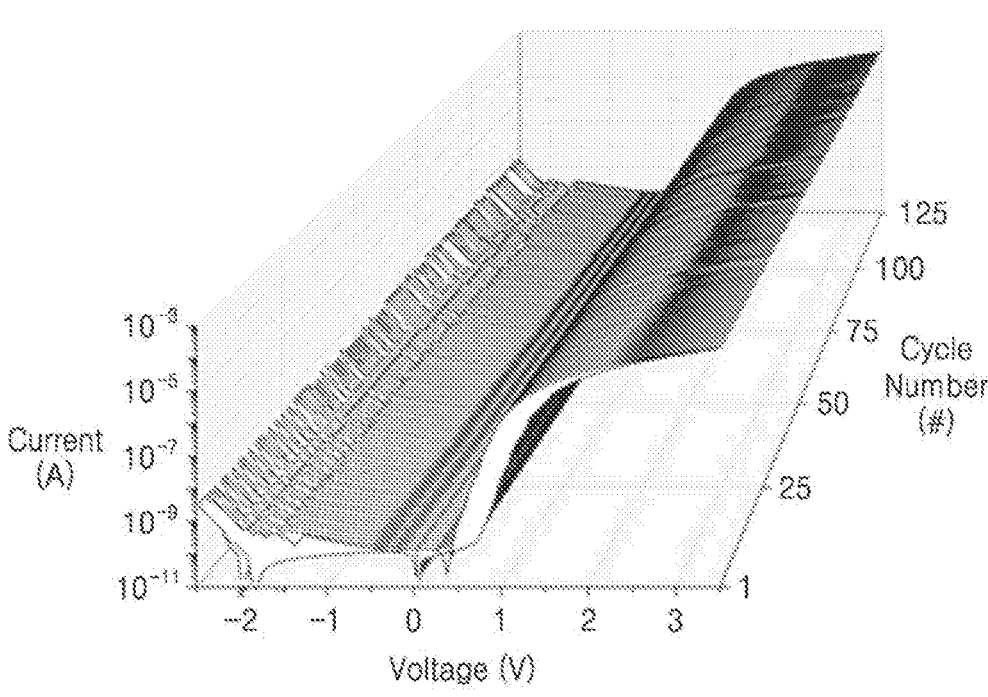
FIG. 7 is a result of performing a voltage sweep test on a memory device according to an embodiment of the disclosure.

FIG. 7 is a result of performing a voltage sweep test on a memory device according to an embodiment of the disclosure. 125 consecutive direct current (DC) voltages were periodically applied to the memory device according to an embodiment of the disclosure without current compliance. Referring to FIG. 7, it may be seen that a temporal variation ($\sigma/\mu$) of about 1.39% occurs even when the voltage sweep is repeated.

Figure 8:
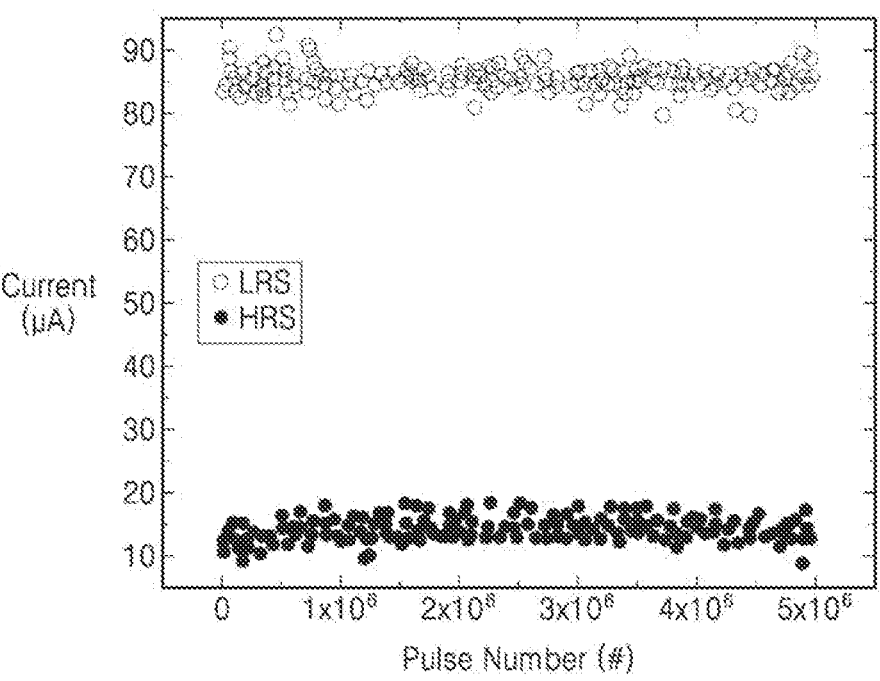
FIG. 8 is a diagram illustrating a change in current according to the number of pulses of a memory device according to an embodiment of the disclosure.

FIG. 8 is a diagram illustrating a change in current according to the number of pulses of a memory device according to an embodiment of the disclosure. As shown in FIG. 8, it may be seen that a current value in a low resistance state and a current value in a high resistance state are constant even when the number of pulses increases. This may mean that the memory device according to an embodiment of the disclosure has high durability.

Figure 9:
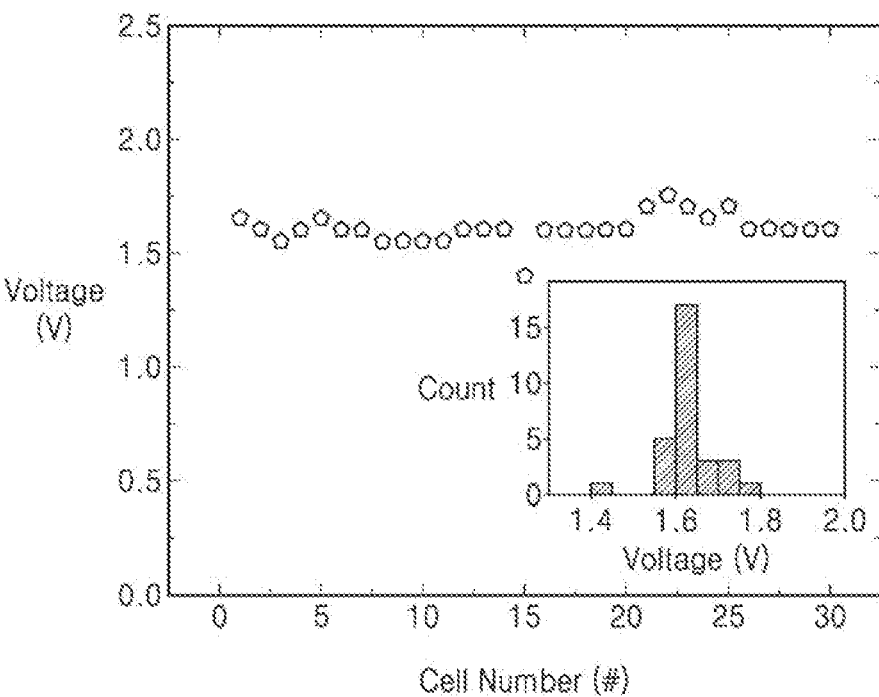
FIG. 9 is a diagram illustrating an operating voltage according to the number of memory devices according to an embodiment of the disclosure.

FIG. 9 is a diagram illustrating an operating voltage according to the number of memory devices according to an embodiment of the disclosure. As shown in FIG. 9, it may be identified that an operating voltage for allowing a current of 1 µA to flow through each memory device is almost similar even when the number of memory devices increases. It was confirmed that the memory device according to an embodiment of the disclosure has a spatial variation ($\sigma/\mu$) of about 3.87%. This confirms that the memory device may stably operate regardless of the number of memory devices.

Figure 10:
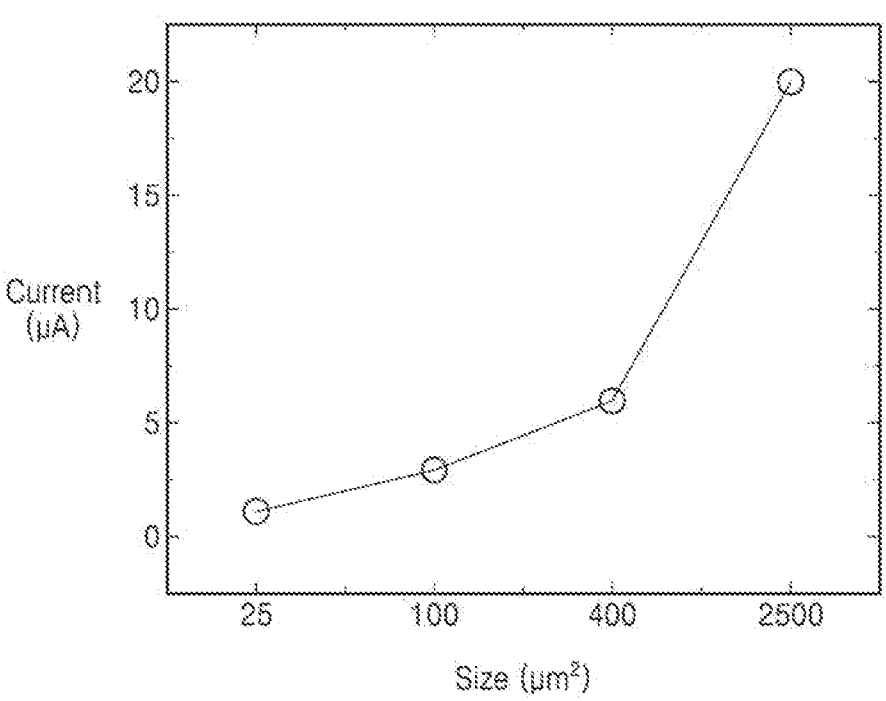
FIG. 10 is a result of measuring current according to a size of a memory device according to an embodiment of the disclosure.

FIG. 10 is a result of measuring current according to a size of a memory device according to an embodiment of the disclosure. A memory device 130 having cross-sections of $5 \times 5$ µm², $10 \times 10$ µm², $20 \times 20$ µm², and $50 \times 50$ µm² were manufactured. Current at 1 V was measured during a linear voltage sweep from 0 V to 4 V. As shown in FIG. 10, it may be confirmed that the measured current value varies according to a cross-sectional size of the memory device. It may be seen that the current value is proportional to the cross-sectional size of the memory device 130.

When the memory device is operated by a conductive filament, a locally formed conductive filament may conduct almost all current regardless of the size of the memory device. Therefore, the current flowing through the memory device by the conductive filament is weakly related to the size of the memory device. However, because resistance of a memory device according to an embodiment of the disclosure changes as oxygen ions move through the entire cross-section of the resistance change layer, a size of the cross-section of the memory device is related to a size of the current. Therefore, when the measured current varies depending on the size, it may be predicted as a memory device having a gradually changing oxygen content according to an embodiment of the disclosure. In addition, a memory size according to an embodiment of the disclosure may have various sizes.

When the resistance change layer is doped with a halogen element, activation energy of oxygen ions in the resistance change layer is lowered, so that the memory device has a higher resistance switching ratio or on/off ratio and a high rectification ratio.

Figure 11A:
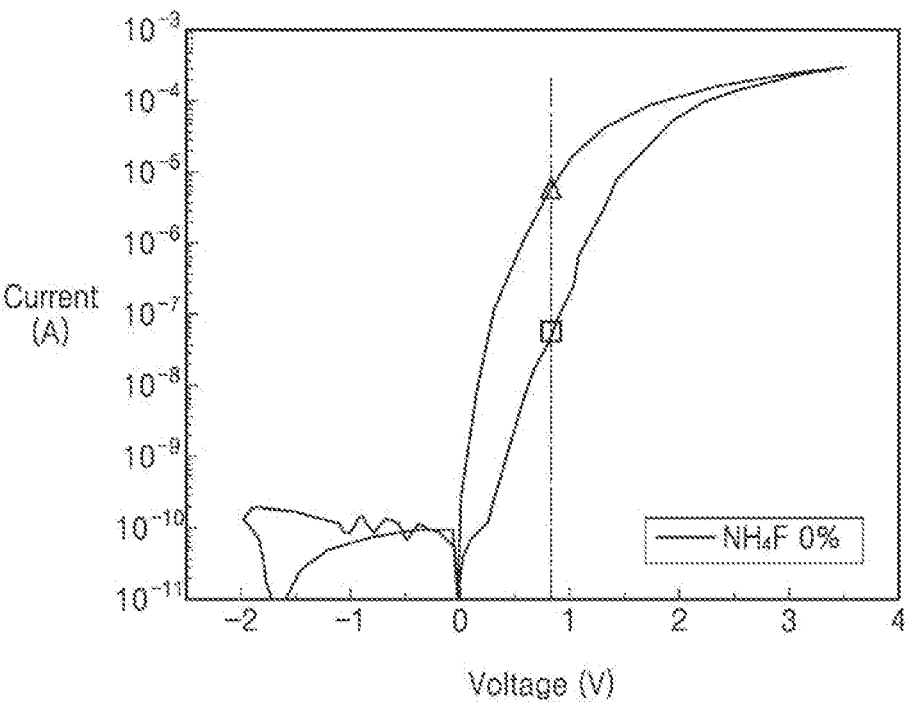
FIG. 11A is an IV characteristic of a memory device in which a resistance change layer is formed in an electrolyte having a fluorine concentration of 0, according to an embodiment of the disclosure.
Figure 11B:
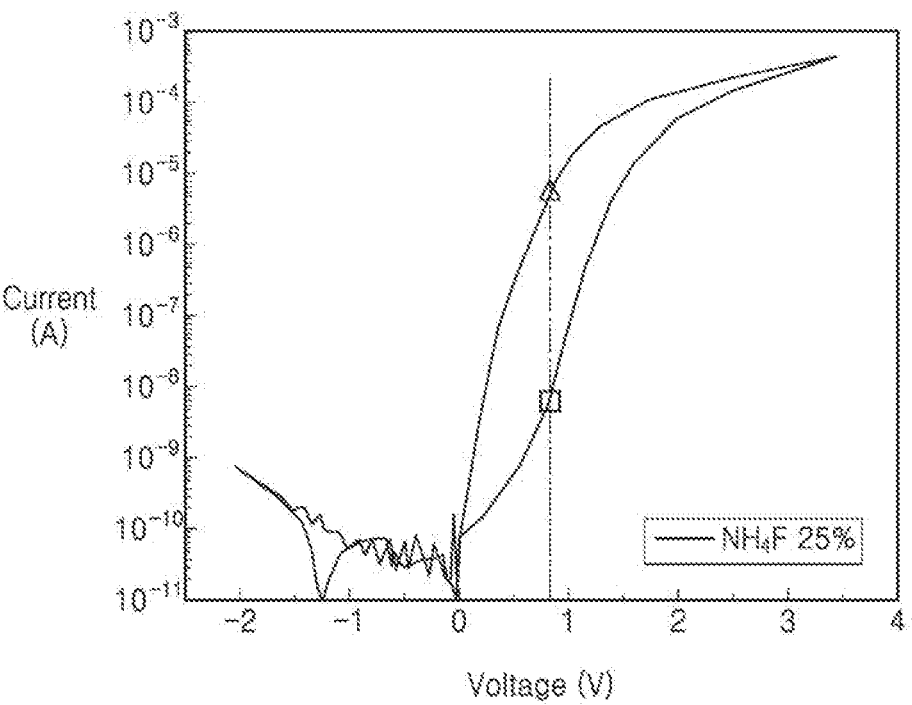
FIG. 11B is an IV characteristic of a memory device in which a resistance change layer is formed in an electrolyte having a fluorine concentration of 25%, according to an embodiment of the disclosure.
Figure 11C:
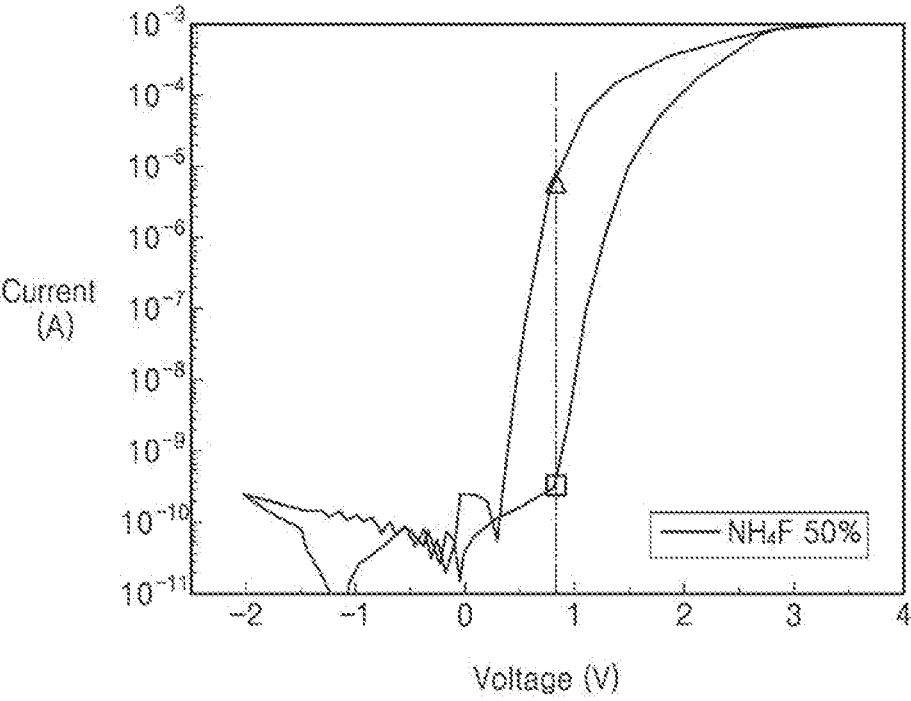
FIG. 11C is an IV characteristic of a memory device in which a resistance change layer is formed in an electrolyte having a fluorine concentration of 50%, according to an embodiment of the disclosure.
Figure 11D:
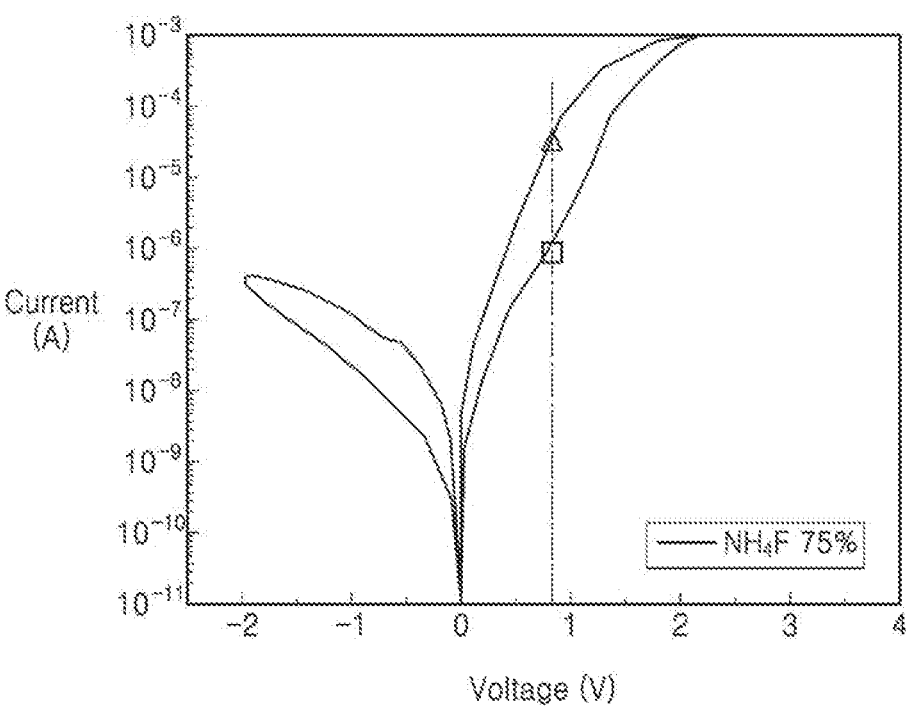
FIG. 11D is an IV characteristic of a memory device in which a resistance change layer is formed in an electrolyte having a fluorine concentration of 75%, according to an embodiment of the disclosure.

FIG. 11A is an IV characteristic of a memory device in which a resistance change layer is formed in an electrolyte having a fluorine concentration of 0 according to an embodiment of the disclosure, FIG. 11B is an IV characteristic of the memory device in which a resistance change layer is formed in an electrolyte having a fluorine concentration of 25% according to an embodiment of the disclosure, FIG. 11C is an IV characteristic of the memory device in which a resistance change layer is formed in an electrolyte having a fluorine concentration of 50% according to an embodiment of the disclosure, and FIG. 11D an IV characteristic of the memory device in which a resistance change layer is formed in an electrolyte having a fluorine concentration of 75% according to an embodiment of the disclosure.

It may be confirmed that the memory device according to an embodiment of the disclosure has a rectification ratio of $10^4$ or more. In the drawings, it may be seen that the memory device according to an embodiment of the disclosure has a rectification ratio of $10^6$ or more. Accordingly, a memory apparatus according to an embodiment of the disclosure may not include a selector, such as a transistor that selects a memory device. This is because a sneak path current problem may not occur because the rectification ratio is high.

As shown in FIG. 11A, even when the resistance change layer 230 is not doped with fluorine, the memory device including the resistance change layer in which the oxygen content gradually changes according to an embodiment of the disclosure has a resistance switching ratio of about $10^2$ or more, that is, an on/off ratio. As shown in FIGS. 11B and 11C, when the resistance change layer 230 is doped with fluorine, it may be seen that the resistance switching ratio increases to $10^3$, $10^4$, and the like. This is because fluorine lowers the activation energy of oxygen ions.

Meanwhile, when fluorine is doped too much, it may be seen that the resistance switching ratio may decrease, as shown in FIG. 11D. This is because fluorine may hinder a movement of oxygen ions. Therefore, it is preferable that the resistance change layer be doped with a halogen element such that the resistance switching ratio is about $10^2$ or more and about $10^5$ or less at an operating voltage of 1 V. Related-art crossbar array memory apparatuses require circuitry to identify conductance changes, which are major bottlenecks. Because the memory device and memory apparatus according to an embodiment of the disclosure have a high resistance switching ratio, an additional circuitry for identifying a conductance change that causes a major bottleneck is not required. Accordingly, the apparatus may be simplified.

Figure 12:
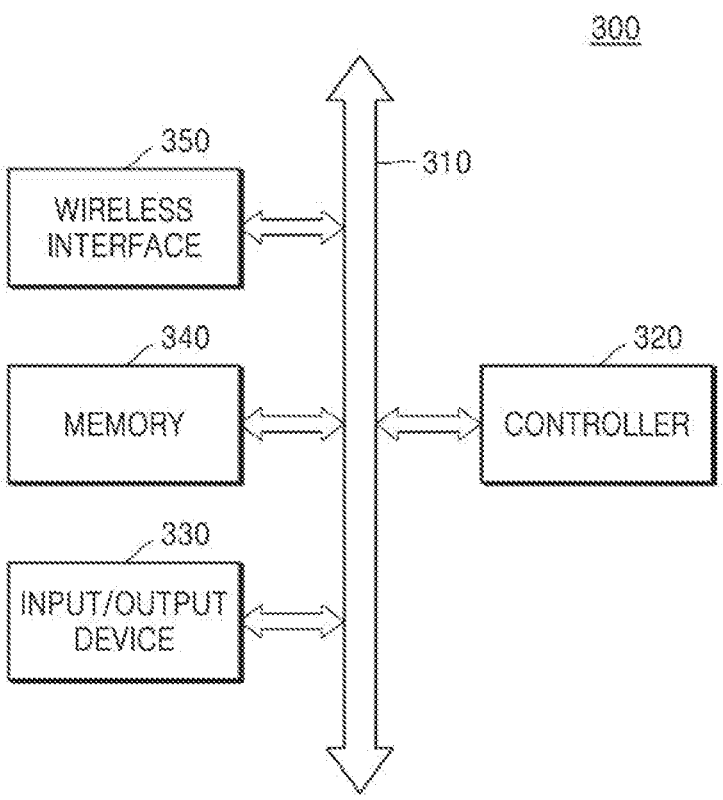
FIG. 12 is a block diagram of an electronic apparatus including a memory apparatus according to an embodiment of the disclosure.

FIG. 12 is a block diagram schematically illustrating an electronic apparatus 300 including a memory apparatus according to an embodiment of the disclosure.

Referring to FIG. 12, the electronic apparatus 300 according to an embodiment may be one of a personal digital assistant (PDA), a laptop computer, a portable computer, a web tablet, a wireless phone, a mobile phone, a digital music player, a wired and wireless electronic device, or a complex electronic apparatus including at least two of the above. The electronic apparatus 300 may include a controller 320, an input/output device 330, such as a keypad, a keyboard, and a display, a memory 340, and a wireless interface 350, which are coupled to each other through a bus 310.

The controller 320 may include, for example, one or more microprocessors, digital signal processors, microcontrollers, or the like. The memory 340 may be used, for example, to store instructions executed by the controller 320.

The memory 340 may be used to store user data. The memory 340 may include at least one of memory apparatuses according to an embodiment of the disclosure.

The electronic apparatus 300 may use the wireless interface 350 to transmit data to or receive data from a wireless communication network that communicates with an RF signal. For example, the wireless interface 350 may include an antenna, a wireless transceiver, and the like. The electronic apparatus 300 may be used in a communication interface protocol, such as a $3^{rd}$ generation communication system, such as Code Division Multiple Access (CDMA), Global System for Mobile communication (GSM), North American Digital Cellular (NADC), Wideband Code Division Multiple Access (WCDMA), or Code-division multiple access 2000 (CDMA2000)

Figure 13:
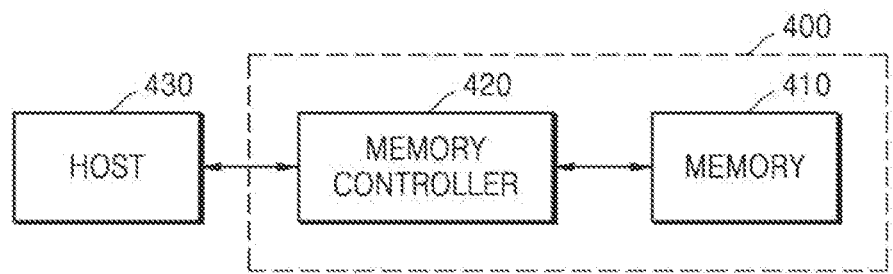
FIG. 13 is a block diagram of a memory system including a memory apparatus according to an embodiment of the disclosure.

FIG. 13 is a block diagram schematically illustrating a memory system 400 including a memory apparatus according to an embodiment of the disclosure.

Referring to FIG. 13, memory apparatuses according to an embodiment of the disclosure may be used to implement a memory system. A memory system 400 may include a memory 410 for storing large amounts of data, and a memory controller 420. The memory controller 420 controls the memory 410 to read or write data stored in the memory 410 in response to a read/write request from a host 430. The memory controller 420 may configure an address mapping table for mapping an address provided from the host 430, for example, a mobile device or a computer system, to a physical address of the memory 410. The memory 410 may include at least one of semiconductor memory apparatuses according to an embodiment of the disclosure.

The memory apparatus according to the embodiments described above may be implemented in a chip form and used as a neuromorphic computing platform.

Figure 14:
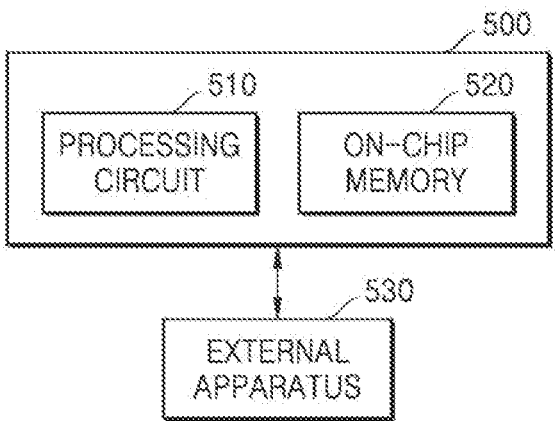
FIG. 14 is a diagram schematically illustrating a neuromorphic apparatus including a memory apparatus according to an embodiment of the disclosure.

FIG. 14 is a diagram schematically illustrating a neuromorphic apparatus including a memory apparatus according to an embodiment of the disclosure. Referring to FIG. 14, a neuromorphic apparatus 500 may include a processing circuit 510 and/or a memory 520. The memory 520 of the neuromorphic apparatus 500 may include a memory system according to an embodiment of the disclosure.

The processing circuit 510 may be configured to control functions for driving the neuromorphic apparatus 500. For example, the processing circuit 510 may control the neuromorphic apparatus 500 by executing a program stored in the memory 520 of the neuromorphic apparatus 500.

The processing circuit 510 may include hardware, such as logic circuitry, a combination of hardware and software, such as a processor executing software, or a combination thereof. For example, the processor may include a central processing unit (CPU), a graphics processing unit (GPU), an application processor (AP) in the neuromorphic apparatus 500, an arithmetic logic unit (ALU), a digital processor, a microcomputer, a field programmable gate array (FPGA), a system-on-chip (SoC), a programmable logic unit, a microprocessor, an application-specific integrated circuit (ASIC), and the like.

In addition, the processing circuit 510 may read and write various data from an external apparatus 530 and execute the neuromorphic apparatus 500 by using the data. The external apparatus 530 may include a sensor array having an external memory and/or an image sensor (e.g., a complementary metal-oxide-semiconductor (CMOS) image sensor circuit).

The neuromorphic apparatus 500 shown in FIG. 14 may be applied to a machine learning system. The machine learning system may utilize various artificial neural network organizations and processing models, including, for example, convolutional neural networks (CNNs), deconvolutional neural networks, recurrent neural networks (RNNs) selectively including a long short-term memory (LSTM) and/or a gated recurrent unit (GRU), stacked neural networks (SNNs), state-space dynamic neural networks (SSDNNs), deep belief networks (DBNs), generative adversarial networks (GANs), and/or restricted Boltzmann machines (RBMs).

Such machine learning systems may include, for example, linear regression and/or logistic regression, statistical clustering, Bayesian classification, decision trees, dimensionality reduction, such as principal component analysis, other types of machine learning models, such as expert systems, and/or a combination thereof, including ensemble techniques, such as random forests. These machine learning models may be used to provide various services, such as an image classification service, a user authentication service based on biometric information or biometric data, an advanced driver assistance system (ADAS), a voice assistant service, and automatic speech recognition (ASR), and may be mounted and executed in other electronic apparatuses.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A memory device comprising:
a first electrode;
a second electrode spaced apart from the first electrode; and
a resistance change layer arranged between the first electrode and the second electrode and doped with a halogen element in a metal oxide having an oxygen content that gradually changes from the second electrode to the first electrode,
wherein an interface adjacent to the first electrode of the resistance change layer has more polycrystalline phase than amorphous phase, and an interface adjacent to the second electrode of the resistance change layer has more amorphous phase than polycrystalline phase, and
wherein the memory device has a resistance switching ratio of about $10^2$ or more.

2. The memory device of claim 1, wherein the halogen element includes at least one of fluorine (F), chlorine (Cl), and bromine (Br).

3. The memory device of claim 1, wherein a doping content of the halogen for the resistance change layer is about 10 at % or less.

4. The memory device of claim 1, wherein the metal oxide includes an anodized metal oxide.

5. The memory device of claim 1, wherein the metal oxide includes tantalum (Ta), titanium (Ti), tin (Sn), chromium (Cr), manganese (Mn), hafnium (Hf), aluminum (Al), niobium (Nb), silicon (Si), lanthanum (La), zirconium (Zr), scandium (Sc), tungsten (W), vanadium (V), and molybdenum (Mo).

6. The memory device of claim 1, wherein the content of oxygen in the resistance change layer gradually decreases from the second electrode to the first electrode.

7. The memory device of claim 1, wherein the resistance change layer includes:

a metal-like region adjacent to the first electrode and having a metal property greater than an insulating property; and an insulator-like region adjacent to the second electrode and having an insulating property greater than an insulating property of a metal.

8. The memory device of claim 7, wherein, when an electric field is formed in the resistance change layer in a direction from the second electrode to the first electrode, a thickness of the metal-like region increases while a thickness of the insulator-like region decreases.

9. The memory device of claim 7, wherein a thickness of the metal-like region and a thickness of the insulator-like region each change according to a movement of oxygen ions included in the resistance change layer.

10. The memory device of claim 9, wherein the oxygen ions move through an entire cross-section of the resistance change layer.

11. The memory device of claim 9, wherein, when the thickness of the insulator-like region is less than or equal to a reference thickness, the resistance change layer is in a low resistance state.

12. The memory device of claim 7, wherein, when a formed electric field is dissipated, the thickness of the metal-like region and the thickness of the insulator-like region are restored to original states.

13. The memory device of claim 1, wherein the resistance change layer is non-porous.

14. The memory device of claim 1, wherein the resistance change layer includes at least one of polycrystalline phase and amorphous phase.

15. The memory device of claim 1, wherein the first electrode includes a same material as a metal included in the resistance change layer.

16. The memory device of claim 1, wherein the memory device has a rectification ratio of about $10^4$ or more.

17. A memory apparatus comprising:

a first conductive line extending in a first direction;

a second conductive line spaced apart from the first conductive line and extending in a second direction crossing the first direction; and a memory device according to claim 1 and arranged at an intersection of the first conductive line and the second conductive line.

* * * * *